United States Patent
Kim

(10) Patent No.: US 7,170,916 B2
(45) Date of Patent: *Jan. 30, 2007

(54) SELECTIVELY ETCHABLE HETEROGENEOUS COMPOSITE DISTRIBUTED BRAGG REFLECTOR

(75) Inventor: Jin K. Kim, St. Louis Park, MN (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/283,311

(22) Filed: Oct. 30, 2002

(65) Prior Publication Data

US 2004/0086013 A1 May 6, 2004

(51) Int. Cl.
*H01S 5/00* (2006.01)
(52) U.S. Cl. .............................. 372/50.124; 372/50.11
(58) Field of Classification Search ................ 372/45, 372/46, 99, 96, 43, 50.124, 50.11
See application file for complete search history.

(56) References Cited

U.S. PATENT DOCUMENTS

| | | | | |
|---|---|---|---|---|
| 5,493,577 A | * | 2/1996 | Choquette et al. ............ 372/46 |
| 5,547,898 A | * | 8/1996 | Grodzinski et al. ........... 117/89 |
| 5,557,626 A | * | 9/1996 | Grodzinski et al. ........... 372/45 |
| 5,696,389 A | * | 12/1997 | Ishikawa et al. .............. 257/99 |
| 5,739,945 A | * | 4/1998 | Tayebati ..................... 359/291 |
| 5,838,705 A | * | 11/1998 | Shieh et al. .............. 372/45.01 |
| 5,985,686 A | * | 11/1999 | Jayaraman .................... 438/32 |
| 6,185,241 B1 | * | 2/2001 | Sun .............................. 372/96 |
| 6,618,414 B1 | * | 9/2003 | Wasserbauer et al. ........ 372/45 |

* cited by examiner

*Primary Examiner*—Armando Rodriguez
(74) *Attorney, Agent, or Firm*—Workman Nydegger

(57) ABSTRACT

DBR mirrors, and vertical cavity surface emitting lasers that incorporate such mirrors, comprised of stacked, multiple levels of different materials having different etching rates for a selected etchant and etching method. Such DBRs are fabricated by etching an upper level(s) down to a lower level(s) to form a pillar or trenched structure, beneficially having an aperture, that has predetermined optical characteristics. When part of a vertical cavity surface emitting laser, a lower level can include an ion-implanted region that optionally extends into an active region and into a bottom DBR.

24 Claims, 3 Drawing Sheets

SELECTIVELY ETCHABLE HETEROGENEOUS COMPOSITE DISTRIBUTED BRAGG REFLECTOR

UNITED STATES GOVERNMENT RIGHTS

This invention was made with the United States Government support under 70NAHB8H4023 awarded by National Institute of Standards and Technology (NIST).

CROSS-REFERENCE TO RELATED APPLICATION

Not Applicable.

BACKGROUND OF THE INVENTION

1. Field of the Invention

This invention relates to distributed Bragg reflectors suitable for use in vertical cavity surface emitting lasers. More specifically, it relates to distributed Bragg reflectors that can be fabricated by etching.

2. Discussion of the Related Art

Vertical cavity surface emitting lasers (VCSELs) represent a relatively new class of semiconductor lasers. While there are many variations of VCSELs, one common characteristic is that they emit light perpendicular to a wafer's surface. Advantageously, VCSELs can be formed from a wide range of material systems to produce specific characteristics. In particular, the various material systems can be tailored to emit different wavelengths, such as 1550 nm, 1310 nm, 850 nm, 670 nm, and so on.

VCSELs include semiconductor active regions, distributed Bragg reflector (DBR) mirrors, current confinement structures, substrates, and contacts. Because of their complicated structure, and because of their material requirements, VCSELs are usually grown using metal-organic chemical vapor deposition (MOCVD) or molecular beam epitaxy (MBE).

FIG. 1 illustrates a typical VCSEL 10. As shown, an n-doped gallium arsenide (GaAS) substrate 12 has an n-type electrical contact 14. An n-doped lower mirror stack 16 (a DBR) is on the substrate 12, and an n-type graded-index lower spacer 18 is disposed over the lower mirror stack 16. An active region 20, usually having a number of quantum wells, is formed over the lower spacer 18. A p-type graded-index top spacer 22 (another confinement layer) is disposed over the active region 20, and a p-type top mirror stack 24 (another DBR) is disposed over the top spacer 22. Over the top mirror stack 24 is a p-type conduction layer 9, a p-type GaAs cap layer 8, and a p-type electrical contact 26.

Still referring to FIG. 1, the lower spacer 18 and the top spacer 22 separate the lower mirror stack 16 from the top mirror stack 24 such that an optical cavity is formed. As the optical cavity is resonate at specific wavelengths, the mirror separation is controlled so as to resonant at a predetermined wavelength (or at a multiple thereof). At least part of the top mirror stack 24 includes an insulating region 40 that provides current confinement. The protons can be implanted, for example, in accordance with the teachings of U.S. Pat. No. 5,115,442, which is incorporated by reference. The oxide layer can be formed, for example, in accordance with the teachings of U.S. Pat. No. 5,903,588, which is incorporated by reference. The insulating region 40 is usually formed either by implanting protons into the top mirror stack 24 or by providing an oxide layer. The insulating region 40 defines a conductive annular central opening 42 that forms an electrically conductive path through the insulating region 40.

In operation, an external bias causes an electrical current 21 to flow from the p-type electrical contact 26 toward the n-type electrical contact 14. The insulating region 40 and the conductive central opening 42 confine the current 21 such that it flows through the conductive central opening 42 to the active region 20. Some of the electrons in the current 21 are converted into photons in the active region 20. Those photons bounce back and forth (resonate) between the lower mirror stack 16 and the top mirror stack 24. While the lower mirror stack 16 and the top mirror stack 24 are very good reflectors, some of the photons leak out as light 23 that travels along an optical path. Still referring to FIG. 1, the light 23 passes through the p-type conduction layer 9, through the p-type GaAs cap layer 8, through an aperture 30 in the p-type electrical contact 26, and out of the surface of the vertical cavity surface emitting laser 10.

It should be understood that FIG. 1 illustrates a common VCSEL structure, and that numerous variations are possible. For example, the dopings can be changed (say, by providing a p-type substrate 12), different material systems can be used, operational details can be tuned for maximum performance, and additional structures, such as tunnel junctions, can be added.

While generally successful, VCSELs have problems. In particular, VCSEL fabrication is often difficult. For example, InP based VCSELs usually incorporate a full DBR stack comprised of InGaAsP/InP or of AlGaInAs/AlInAs as a top mirror. Such mirrors are typically 7–10 µm thick. This presents a problem when attempting proton implantation to produce current confinement because commonly available implant species can be implanted only about 4 µm when using commonly available equipment. Thus, the top DBR mirror needs to be partially etched such that the top DBR mirror has the correct dimensions for reflection, and such that implantation can be properly performed. Selective etching in InGaAsP/InP or in AlGaInAs/AlInAs material systems is difficult to do, particularly when using plasma etching. This is because the etch-rate contrast between two compositions of InGaAsP/InP or of AlGaInAs/AlInAs is not significant. It is known to use a combination of plasma and wet etching to selectively etch, but at the expense of lateral definition.

Other uses of selectively etched DBRs exist. For example, with a selectively etched DBR it would be possible to replace some of the top DBR with metal to improve heat dissipation. Furthermore, selective, controlled etching can be used to produce novel VCSELs. Therefore, a distributed Bragg reflector that can be selectively etched in a simple manner with controlled results would be beneficial. Also beneficial would be a distributed Bragg reflector that is suitable for use in vertical cavity surface emitting lasers and that can be accurately etched would be beneficial. Also beneficial would be a vertical cavity surface emitting laser having a distributed Bragg reflector with selected structures, particularly when that DBR includes an oxide structure having an aperture.

SUMMARY OF THE INVENTION

Accordingly, the principles of the present invention provide for selectively etching a distributed Bragg reflector to have controlled structures. The principles of the present invention further provide for a distributed Bragg reflector comprised of stacked levels of different materials. Beneficially such distributed Bragg reflectors are implemented by stacking two or more partial DBRs of different compositions that have different etching characteristics, with the sum of the partial DBRs producing a full DBR stack having desired optical parameters. The stacked partial DBRs may be lattice-matched. The stacked partial DBRs can then be etched to produce controlled structures.

A distributed Bragg reflector according to the principles of the present invention is a pillared mirror comprised of stacked levels of different materials. Alternatively, the mirror may be defined by a trench or trenches. Such a distributed Bragg reflector beneficially includes an oxidizable layer that produces an oxide structure having an aperture.

A vertical cavity surface emitting laser according to the principles of the present invention includes a distributed Bragg reflector that is comprised of stacked levels of different materials that form a pillar or trenched structure. Such a distributed Bragg reflector beneficially includes an oxidizable layer that produces an oxide structure having an aperture.

A distributed Bragg reflector according to the principles of the present invention includes a first level and a second level, wherein the first level is comprised of a first set of materials and the second level is comprised of a second set of materials, wherein the first set of materials and the second set of materials have different etching characteristics, and wherein the sum of the optical effects of the first level and of the second level produce a distributed Bragg reflector having predetermined reflective properties. Beneficially, the first level is comprised of InGaAsP/InP or AlGaInAs. Also beneficially, the second level is comprised of AlGaAs or AlGaAsSb. The second level extends over part of the first level. Beneficially, the second level includes an oxidized layer that forms an oxide structure having an aperture. Also beneficially, the distributed Bragg reflector is fabricated by forming the first level and the second level, then selectively etching part of the second level down to the first level using the first level as an etch stop. Beneficially, the second level is etched using a chlorine plasma etch that stops on the first level.

Additional features and advantages of the invention will be set forth in the description that follows, and in part will be apparent from that description, or may be learned by practice of the invention.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings.

Figure 1:
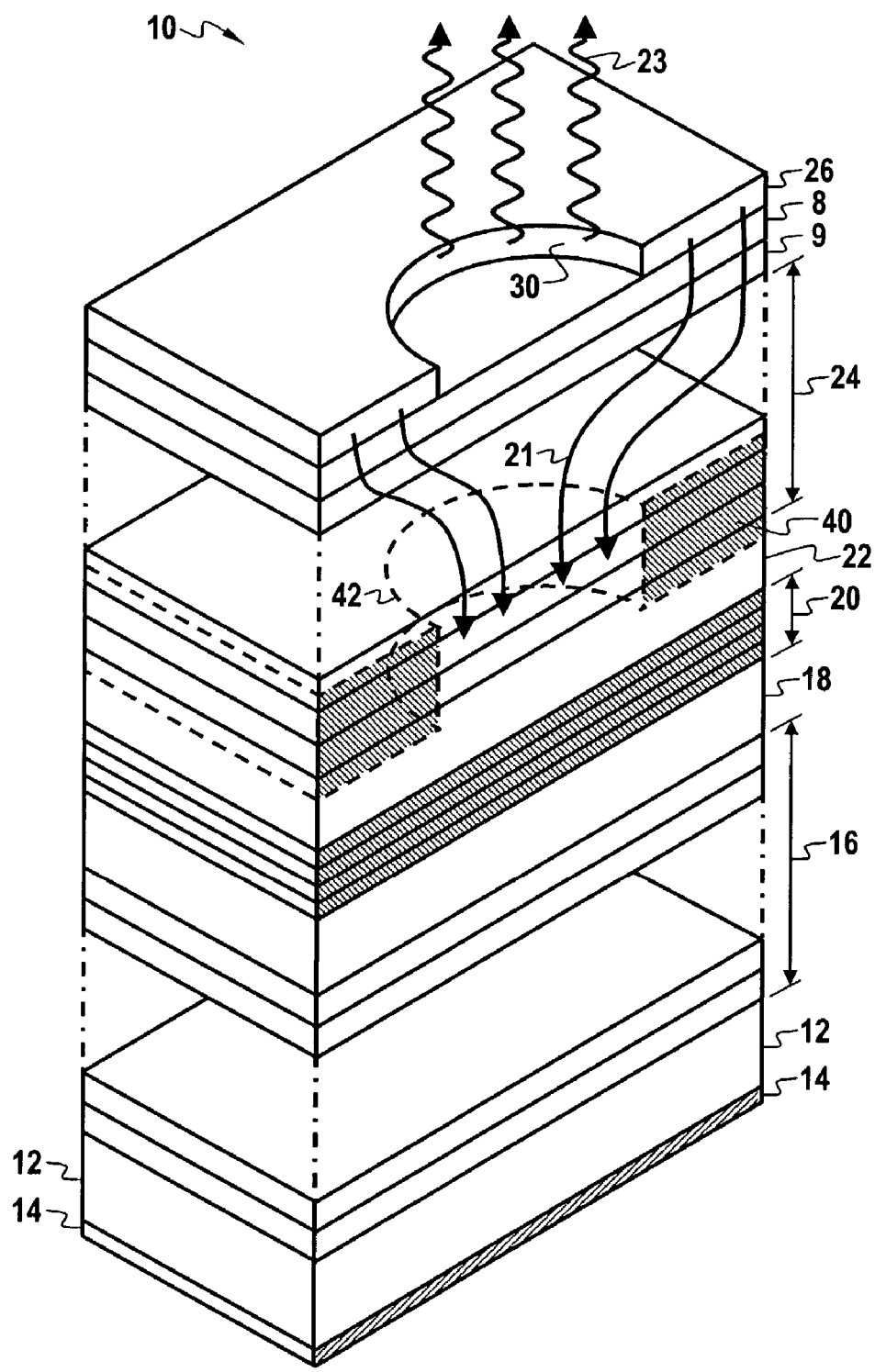
FIG. 1 illustrates a typical vertical cavity surface emitting laser.

Note that in the drawings that like numbers designate like elements. Additionally, for explanatory convenience the descriptions use directional signals such as up and down, top and bottom, and lower and upper. Such signals, which are derived from the relative positions of the elements illustrated in the drawings, are meant to aid the understanding of the present invention, not to limit it.

DETAILED DESCRIPTION OF AN ILLUSTRATED EMBODIMENT

The principles of the present invention are illustrated in the Figures, which illustrate a VCSEL that includes a top DBR that is comprised of multiple stacked levels that are beneficially formed by selective etching. However, the principles of the present invention are broader than the illustrated VCSEL. Therefore, the present invention is to be limited only by the claims as broadly understood in view of the United States Patent Laws.

Figure 2:
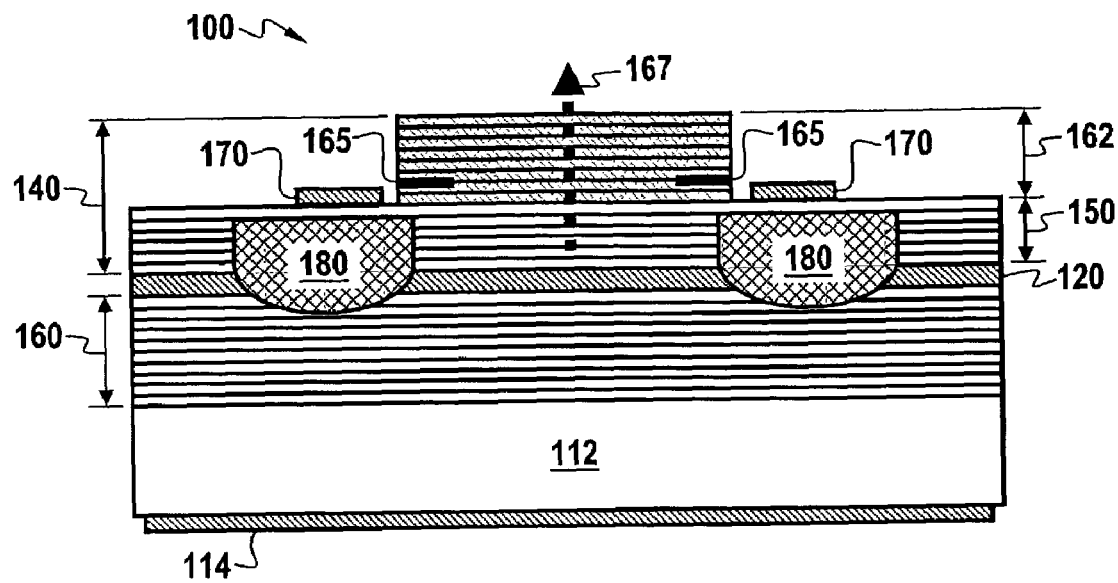
FIG. 2 is a simplified illustration of a vertical cavity surface emitting laser that incorporates distributed Bragg reflectors and that is in accord with the principles of the present invention.

Refer now to FIG. 2 for a simplified illustration of a vertical cavity surface emitting laser (VCSEL) 100 that is in accord with the principles of the present invention. FIG. 2 should be understood as a simplified "cut-away" schematic depiction of a VCSEL that is generally configured as shown in FIG. 1. However, the VCSEL 100 includes novel features, subsequently described, that render it particularly suitable for commercial applications.

As shown, the VCSEL 100 includes an n-doped substrate 112 having an n-type electrical contact 114. An n-type electrical may be formed on top of the lower mirror stack 160 in substitute or in addition to the illustrated contact of 114. Suitable substrate materials include GaAs, InP, and InAs/GaSb. An n-doped lower mirror stack 160 (a DBR) is over the substrate 112. That lower mirror stack optionally includes an n-type graded-index lower spacer. For high reflectivity and high thermal conductivity the lower mirror stack 160 is beneficially comprised of AlGaInAs/InP. Alternatively, for ease of implementation the lower mirror stack can be comprised of InGaAsInP.

Still referring to FIG. 2, over the lower mirror stack 160 is an active region 120 having P-N junction structures with a number of quantum wells. The composition of the active region 120 is beneficially AlGaInAs, with the specific aluminum content varying in the different layers that form the active region 120. For example, one layer may have between twenty and thirty percent aluminum, while an adjacent layer might have between zero and five percent aluminum. There could be many alternating layers, depending how the quantum wells are to be implemented.

Over the active region 120 is a pillared p-type top mirror stack 140 (another DBR). Alternatively, the top mirror stack 140 may be defined by etching a trench or trenches around a desired structure. Optionally, the top mirror stack includes a top spacer. In any event, the lower mirror stack 160 is separated from the top mirror stack 140 such that an optical cavity that is resonant at a predetermined wavelength is formed.

Still referring to FIG. 2, the pillared top mirror stack 140 is comprised of multiple levels, a first level 150, beneficially of InGaAsP/InP and/or AlGaInAs, and a second level 162, beneficially of AlGaAs, AlGaAsSb, or of oxidized materials, that extends over part of the first level 150. Top contacts 170 are formed on the first level or on the second level.

The second level 162 optionally includes an oxide structure 165 that forms an aperture for light 167 to pass through. While the oxide structure 165 can be comprised of an oxidized aluminum layer, an air gap is also suitable.

The VCSEL 100 also includes an ion-implanted region 180 in the first level and optionally through the active region and into part of the bottom DBR 160. The ion implanted region 180 confines current through a desired region of the active area 120. Furthermore, if the VCSEL 100 is part of a VCSEL array, the ion implanted region 180 assists isolating the individual VCSELs 100 of that array. The VCSEL 100 combines benefits of ion implant isolation and an oxide aperture.

It should be clearly understood that the VCSEL 100 is an unscaled illustration of one possible VCSEL that is in accord with the principles of the present invention. In particular, it should be understood that the principles of the present invention provide for more than two "partial DBRs" (in FIG. 2, each level is a partial DBR). Additionally, a partial DBR can be comprised of a single material layer having an arbitrary thickness, or of multiple levels of different materials. Additionally, more than one partial DBR can be etched. For example, in a "three level" distributed Bragg reflector that is in accord with the principles of the present invention, multiple etches may be used to produce tiered mesas, with the top two levels being etched in succession using two separate etches and two different etch masks.

One particularly beneficial distributed Bragg reflector uses metamorphic AlGaAs in the second level 162 (an etched partial DBR) and InGaAsP in the first level 150 (an unetched partial DBR), all on an InP substrate. That embodiment simplifies implementing oxide structures and air apertures.

It should be noted that in VCSELs where electrical contacts are formed on or below the first level (the unetched partial DBR) then the partial DBR(s) above the electrical contacts do not have to be conducting. This lifts the constraints of low voltage drops through the non-conducting partial DBRs, which allows the use of abrupt DBR interfaces and materials of poor electrical conductivity, such as "metamorphic" AlGaAs/GaAs DBRs on InP. Indeed, in such VCSELs the DBR(s) above the contacts may be made of dielectric materials, such as SiNx and SiOx, or a combination of dielectric and semiconductor materials, such as Si and AlO. However, semiconductor materials that can be epitaxially grown are preferred. Another possibility is a semiconductor partial DBR that oxidizes to produce desired characteristics, for example an AlGaAs/GaAs pair.

It should also be noted that the second level (upper and etched partial DBR) can be the only feature that protrudes from the surface, thus maintaining much of the desirability of planar processing. Beneficially, the second level DBR structure can be used as implantation and/or as metallization masks.

Figure 3:
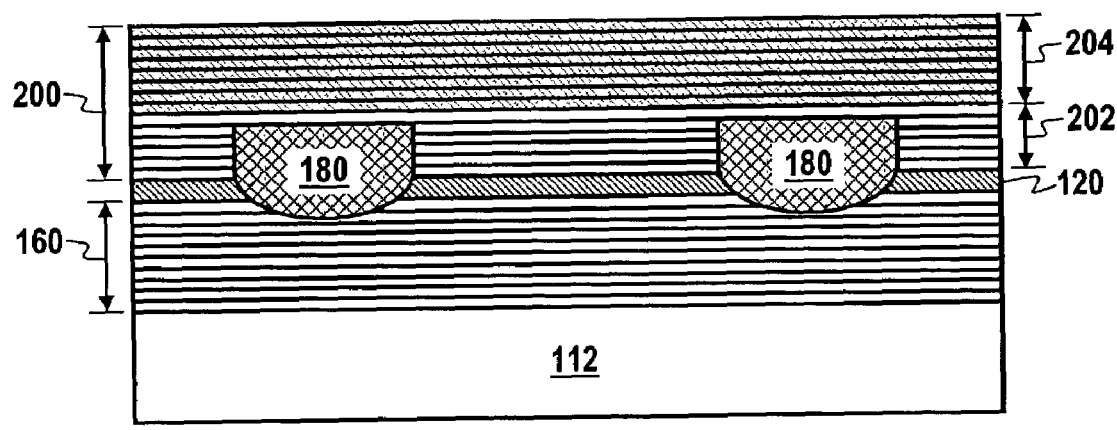
FIG. 3 illustrates the vertical cavity surface emitting laser of FIG. 2 during fabrication.

Beneficially, the VCSEL 100 is fabricated using standard fabrication techniques and processes until the top mirror stack 140 is being formed. Referring now to FIG. 3 for a simplified depiction of the VCSEL 100 during its fabrication. After fabrication of the lower mirror stack 160 on the substrate 112, and the active region 120 on the lower mirror stack 160, bulk top mirror stack 200 comprised of a first structure 202 of InGaAsP/InP or of AlGaInAs, and a second structure 204 of AlGaAs, of AlGaAsSb, or of an oxidizable material is formed on the active layer. As shown, the ion-implanted region 180 is formed after the growth of the first structure 202 by driving ions into the first structure using normal ion implant equipment. The ions produce structural damage in the ion-implanted region such that the current confining ion-implanted region 180 is formed.

Figure 4:
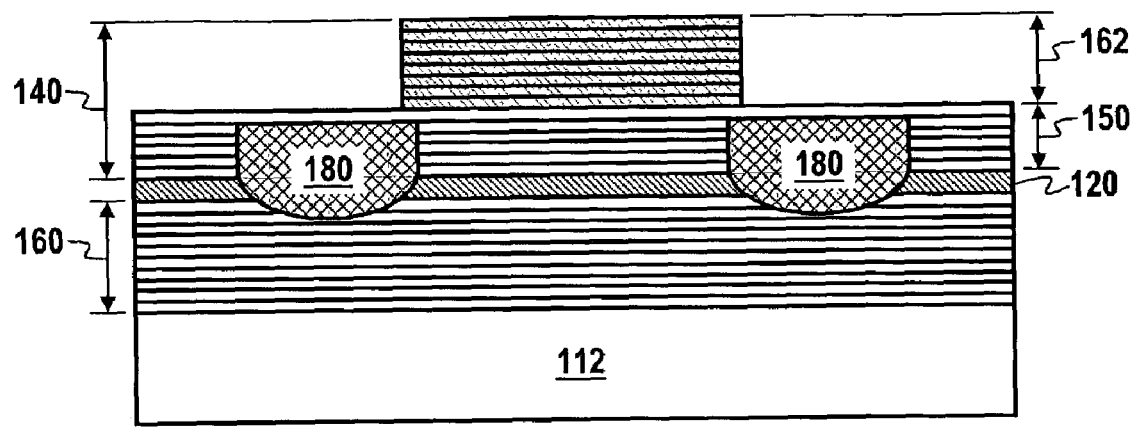
FIG. 4 illustrates the vertical cavity surface emitting laser structure of FIG. 3 after further fabrication.

Referring now to FIG. 4, part of the second structure 204 is etched down to the first structure 202 using chlorine plasma. This result is that the second structure 204 is formed into a pillar, and the first level 150 and the second level 162 are defined.

Figure 5:
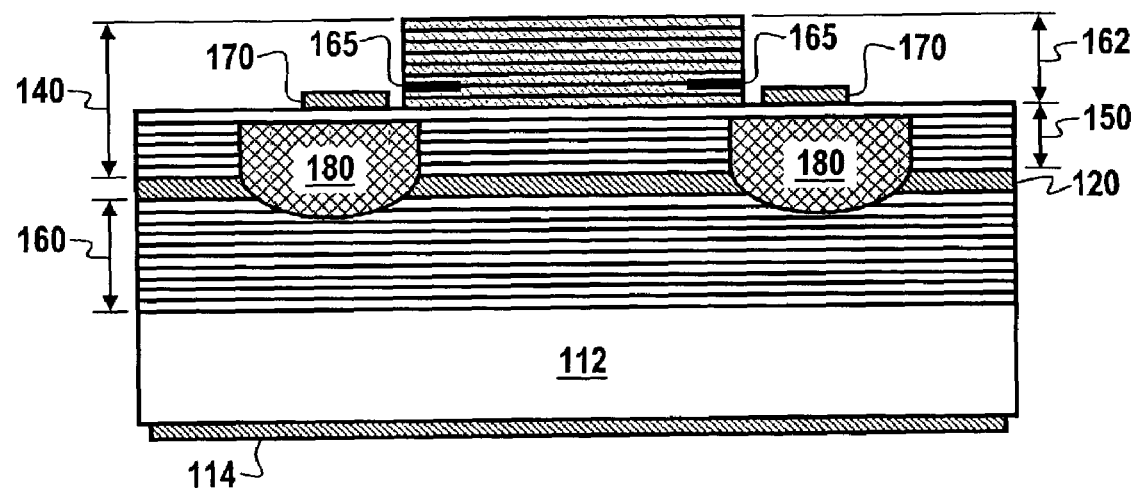
FIG. 5 illustrates the vertical cavity surface emitting laser structure of FIG. 4 after completion.

Then, referring now to FIG. 5, a layer of the second level 162 is oxidized into the oxide structure 165. Alternatively, part of the second level 162 could be etched away to form an air gap. Then, the electrical contact 114 and the top contacts 170 are formed.

If more then two levels are being used, other layers can be selectively etched. For example, a methane/hydrogen/argon plasma etch can be used to etch the first level.

While the specific embodiments described above illustrate an n-type DBR on the bottom and a p-type DBR on the top, this is arbitrary. The n-type DBR could be on the top and the p-type could be on the bottom. Furthermore, both the top and bottom DBRs may be doped the same type (possibly by incorporating a tunnel junction), or may even be undoped. Thus, the principles of the present invention can be used in numerous ways. The substrate choice is also arbitrary. While certain applications may favor a particular type of substrate, the principles of the present invention are applicable when two or more partial DBRs can be stacked, and one or more of the partial DBRs can be selectively removed from a predetermined area.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A Vertical Cavity Surface Emitting Laser, comprising:
a substrate;
an active region over said substrate, said active region for emitting light at a predetermined wavelength;
a bottom distributed Bragg reflector mirror disposed between said active region and said substrate, said bottom distributed Bragg reflector mirror for reflecting light emitted by said active region back to said active region; and
a top distributed Bragg reflector mirror adjacent said active region, said top distributed Bragg reflector mirror for reflecting light emitted by said active region back to said active region, wherein said top distributed Bragg reflector mirror has both a first level and a second level that partially extends over, and is adjacent to, said first level with no intervening layers;
wherein said first level is comprised of a first set of materials;
wherein said second level is comprised of a second set of materials;
wherein said first set of materials and said second set of materials have significantly different etch rates for a selected etchant and etching method;
wherein a combination of said first level and of said second level produces a predetermined reflection characteristic; and
wherein said first level includes an ion-implanted region.

2. A Vertical Cavity Surface Emitting Laser according to claim 1, wherein said first level is comprised of a material combination selected from a group consisting of AlGaInAs, AlInAs, InGaAsP, and InP, and combinations thereof.

3. A Vertical Cavity Surface Emitting Laser according to claim 1, wherein said second level is comprised of a material combination selected from a group consisting of AlGaAs and AlGaAsSb, and combinations thereof.

4. A Vertical Cavity Surface Emitting Laser according to claim 1, wherein said second level is comprised of an oxidized material.

5. A Vertical Cavity Surface Emitting Laser according to claim 1, wherein said second level includes an aperture.

6. A Vertical Cavity Surface Emitting Laser according to claim 1, further including an electrical contact.

7. A Vertical Cavity Surface Emitting Laser according to claim 1, further including a bottom contact.

8. A method of fabricating a Vertical Cavity Surface Emitting Laser, comprising:
   forming a bottom distributed Bragg reflector mirror on a substrate;
   forming an active region on the bottom distributed Bragg reflector mirror; and
   forming a top distributed Bragg reflector mirror on the active region, wherein the top distributed Bragg reflector mirror is formed by:
      growing a first level of a first material combination over the active region, wherein the first material has first optical properties and a first etching rate to a selected etchant;
      forming an ion-implanted region in said first level;
      growing a second level of a second material combination adjacent to the first level with no intervening layers, wherein the second material has second optical properties and a second etching rate to the selected etchant, wherein the second etching rate is substantially greater than the first etching rate;
      masking the second level; and
      etching the second level using the selected etchant such that a pillar of the second material is formed and such that the first level acts as an etch stop.

9. A method of fabricating a Vertical Cavity Surface Emitting Laser according to claim 8, further including the step of forming a top contact.

10. A method of fabricating a Vertical Cavity Surface Emitting Laser according to claim 8, further including the step of forming an aperture in the second level.

11. A method of fabricating a Vertical Cavity Surface Emitting Laser according to claim 8, wherein the first material combination is selected from a group consisting of AlGaInAs, AlInAs, InGaAsP, and InP, and combinations thereof.

12. A method of fabricating a Vertical Cavity Surface Emitting Laser according to claim 8, wherein the second material combination is selected from a group consisting of AlGaAs and AlGaAsSb, and combinations thereof.

13. A Vertical Cavity Surface Emitting Laser according to claim 8, wherein said second material is comprised of an oxidized material.

14. A method of fabricating a Vertical Cavity Surface Emitting Laser, comprising:
   forming a bottom distributed Bragg reflector mirror on a substrate;
   forming an active region on the bottom distributed Bragg reflector mirror; and
   forming a top distributed Bragg reflector mirror on the active region, wherein the top distributed Bragg reflector mirror is formed by:
      growing a first level of a first material combination over the top active region, wherein the first material has first optical properties and a first etching rate to a selected etchant;
      growing a second level of a second material combination adjacent to the first level, wherein the second material has second optical properties and a second etching rate to the selected etchant, wherein the second etching rate is substantially greater than the first etching rate;
      masking the second level;
      etching the second level using the selected etchant such that a confined region defined by trenches is formed and such that the first level acts as an etch stop; and
      forming an aperture in said second level.

15. A method of fabricating a Vertical Cavity Surface Emitting Laser according to claim 14, further including the step of forming an ion-implanted region in the first level.

16. A method of fabricating a Vertical Cavity Surface Emitting Laser according to claim 14, further including the step of forming a top contact.

17. A method of fabricating a Vertical Cavity Surface Emitting Laser according to claim 14, wherein the first material combination is selected from a group consisting AlGaInAs, AlInAs, InGaAsP, InP, and combinations thereof.

18. A method of fabricating a Vertical Cavity Surface Emitting Laser according to claim 14, wherein the second material combination is selected from a group consisting of AlGaAs and AlGaAsSb, and combinations thereof.

19. The Vertical Cavity Surface Emitting Laser as recited in claim 1, wherein said first level includes an optical aperture.

20. The Vertical Cavity Surface Emitting Laser as recited in claim 1, wherein said second level includes an optical aperture that comprises an oxidized layer.

21. The Vertical Cavity Surface Emitting Laser as recited in claim 1, wherein said second level includes an optical aperture that comprises an air gap.

22. A VCSEL manufactured according to the method of claim 8.

23. A VCSEL manufactured according to the method of claim 14.

24. A Vertical Cavity Surface Emitting Laser, comprising:
   a substrate;
   an active region over said substrate, said active region for emitting light at a predetermined wavelength;
   a bottom distributed Bragg reflector mirror disposed between said active region and said substrate, said bottom distributed Bragg reflector mirror for reflecting light emitted by said active region back to said active region; and
   a top distributed Bragg reflector mirror adjacent said active region, said top distributed Bragg reflector mirror for reflecting light emitted by said active region back to said active region, wherein said top distributed Bragg reflector mirror has both a first level and a second level that partially extends over, and is adjacent to, said first level;
   wherein said first level is comprised of a first set of materials;
   wherein said second level is comprised of a second set of materials;
   wherein said first set of materials and said second set of materials have significantly different etch rates for a selected etchant and etching method;
   wherein a combination of said first level and of said second level produces a predetermined reflection characteristic; and
   wherein said second level includes an aperture.

* * * * *